United States Patent [19]

Stern et al.

[11] Patent Number: 4,784,700
[45] Date of Patent: Nov. 15, 1988

[54] POINT FOCUS SOLAR CONCENTRATOR USING REFLECTOR STRIPS OF VARIOUS GEOMETRIES TO FORM PRIMARY AND SECONDARY REFLECTORS

[75] Inventors: Theodore G. Stern; Mickey Cornwall; Bela Kaincz; James W. Mildice, all of San Diego, Calif.

[73] Assignee: General Dynamics Corp./Space Systems Div., San Diego, Calif.

[21] Appl. No.: 53,972

[22] Filed: May 26, 1987

[51] Int. Cl.[4] ............................ H02N 6/00; F24J 3/02
[52] U.S. Cl. ..................................... 136/248; 136/253; 126/438; 126/439; 350/613; 350/614
[58] Field of Search ....................... 136/246, 248, 253; 126/438, 439; 350/613, 614, 628

[56] References Cited

U.S. PATENT DOCUMENTS

| | | | |
|---|---|---|---|
| 3,613,659 | 10/1971 | Phillips | 126/424 |
| 3,902,794 | 9/1975 | Abrams | 350/613 |
| 4,198,826 | 4/1980 | Chromie | 60/641.15 |
| 4,301,321 | 11/1981 | Bartels | 136/246 |

FOREIGN PATENT DOCUMENTS

| | | | |
|---|---|---|---|
| 2907128 | 8/1979 | Fed. Rep. of Germany | 126/438 |
| 866344 | 9/1981 | U.S.S.R. | 126/438 |
| 2099604 | 12/1982 | United Kingdom | 126/438 |

Primary Examiner—Aaron Weisstuch
Attorney, Agent, or Firm—John R. Duncan; Frank D. Gilliam

[57] ABSTRACT

A point focus solar concentrator which uses various geometries of cylindrical reflector strips some of which are tilted to simulate a point focus by overlaying the line focii of each segment at a coincident point. Several embodiments of the invention are disclosed that use cylindrical parabolic, cylindrical hyperbolic or flat reflector strips to concentrate incident solar energy for use by a solar dynamic engine located at the focal point. Also disclosed is a combined photovoltaic/solar dynamic engine concentrator energy system that uses this arrangement of mirrors.

7 Claims, 5 Drawing Sheets

POINT FOCUS SOLAR CONCENTRATOR USING REFLECTOR STRIPS OF VARIOUS GEOMETRIES TO FORM PRIMARY AND SECONDARY REFLECTORS

BACKGROUND OF THE INVENTION

This invention relates to solar dynamic conversion systems as an energy source for high power spacecraft, such as in a space station.

Large parabolic and cassegrainian dish concentrators, which have been proposed for concentrating sunlight onto heat receivers, have manufacturing and packaging problems.

The purpose of this invention is to provide solar conversion systems with a high concentration of solar flux into a solar receiver through the use of an optical system comprising a Fresnel arrangement of cylindrical parabolic, cylindrical hyperbolic, and flat reflector strips. Such a system will hereafter be referred to as a "point focus solar concentrator".

The advantages of using cylindrical rather than dish shaped parabolic mirrors are that (1) they are easier to form and polish since they have a simple curvature, (2) are easier to stack and package into cylindrical launch envelopes, such as the Space shuttle Payload bay, (3) and provide a relatively flat surface for placing a coating for the reflectors. In those point focus solar concentrators that use flat reflector strips, such strips can be easily manufactured from flat metal or glass strips.

It is therefore a primary object of this invention to provide a point focus solar concentrator which overcomes the disadvantages of the prior art and is capable of providing high concentration of solar flux onto a heat receiver and which is easy to manufacture and package.

SUMMARY OF THE INVENTION

The point focus solar concentrator which meets the foregoing object comprises the use of reflector strips for fabricating primary and secondary reflectors. These strips, which each provide a line focus equal to the width of the strip, can be individually tilted to superimpose these line focii for higher concentration, or can be oriented parallel to each other and supplemented by a secondary reflector that uses reflector strips to superimpose the line focii. Either approach provides the necessary high concentration ratio for energy for use by a solar dynamic engine located at the focal point. Several embodiments of the invention include flat or hyperbolic secondary reflectors, and provisions for focal length correction through variations in the primary or secondary reflector strip curvatures. Also included is a combined photovoltaic/solar-dynamic engine concentrator system.

DETAILED DESCRIPTION

Figure 1A:
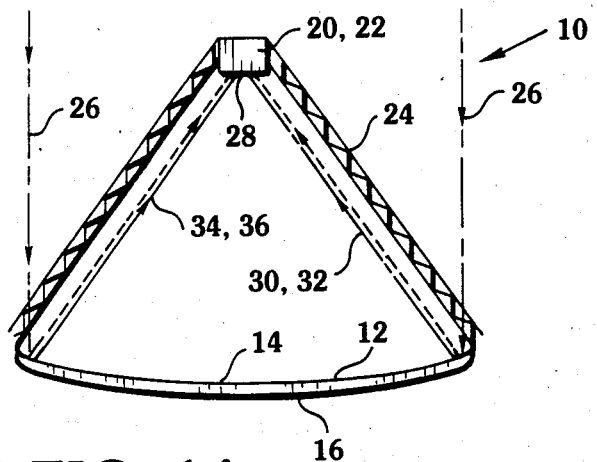
FIGS. 1A and 1B are simplified schematic frontal and side illustrations of the first embodiment of the invention utilizing tilted parabolic primary reflector strips, each having a predetermined different focal length and a heat receiver and a solar dynamic engine suspended at the reflector focus some distance above the reflecting surface.
Figure 1B:
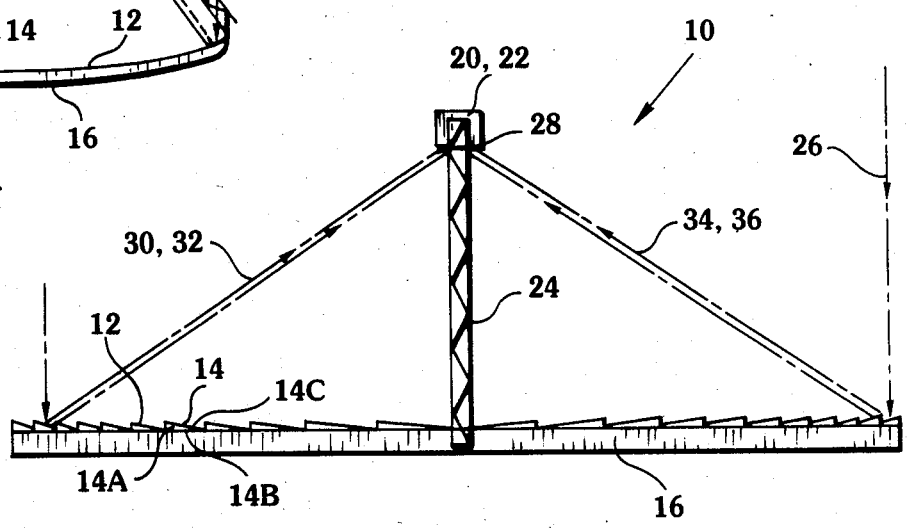
Figure 1C:
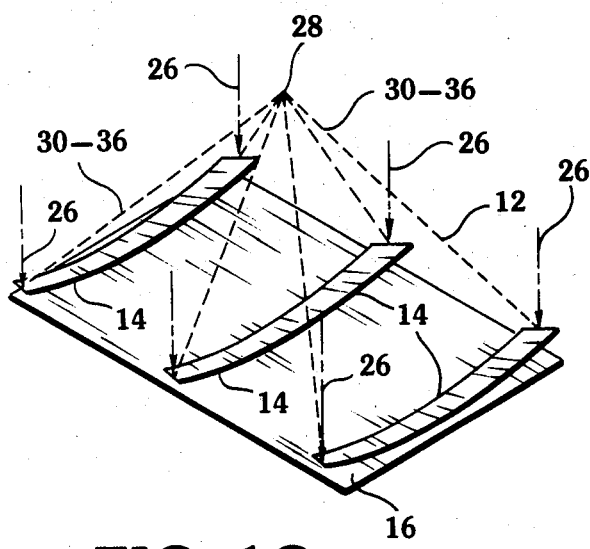
FIG. 1C is a perspective view of the embodiment of FIGS. 1A and 1B to illustrate more clearly the reflector strips and the direction of the solar rays towards the point focus.

Turning first to FIGS. 1A-1C, there is illustrated a first embodiment of a point focus solar concentrator of this invention, designated as 10, and depicted as a primary reflector 12 comprising a series of parabolic cylindrical primary reflector strips 14, positioned on a base 16 and an apertured heat receiver 20 with a solar heat dynamic engine 22. The heat receiver 20 with a solar heat engine 22 are located at the focus of the primary reflector 12 and are supported by a suitable structure 24.

Reflector strips 14 (which also may be referred to as mirror strips or mirror elements) may be fabricated of any suitable material suitable to a space environment, such as mechanically formed sheet metal aluminum or copper, coated with a reflective layer of silver or aluminum, or any suitable substrate material coated with organic reflective films made of Mylar, Teflon or Kapton with integral silver or aluminum layers. The reflector strips 14 that are flat may also be made of coated glass. As shown in FIG. 1B, each reflector strip 14 is triangular in cross section and comprises a supporting rib 14a with a diagonal 14b with a reflector surface 14c.

In the views of FIGS. 1A-1C, the primary reflector 12 is shown reflecting incoming solar energy, depicted as rays 26, toward a focal point 28 with each primary reflector strip 14 having a different curvature to provide different focal lengths. The difference in the focal lengths of the strips is illustrated by the reflected rays 30, 32, 34 and 36 which are wedged-shaped beams of solar flux intercepted in their entirety by the apertured heat receiver 20 which collects the individual rays for heating the working fluid for operation of the solar heat dynamic engine 22. In FIGS. 1A and 1B, ray 36 is shown behind ray 34 and ray 32 is shown behind ray 30 to illustrate the curvature of the rays. Note the change in position of the rays shown in FIG. 1B.

Figure 2A:
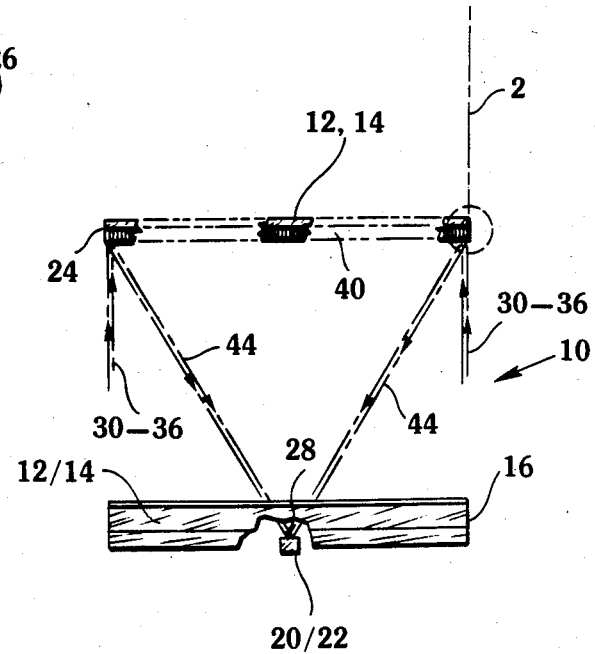
FIGS. 2A and 2B and 2C are simplified schematic frontal and side illustrations of the invention using parallel (not tilted) primary cylindrical parabolic reflector strips, each having a predetermined different focal length and a secondary mirror comprising flat oriented reflector strips each having a predetermined different tilt orientation.
Figure 2B:
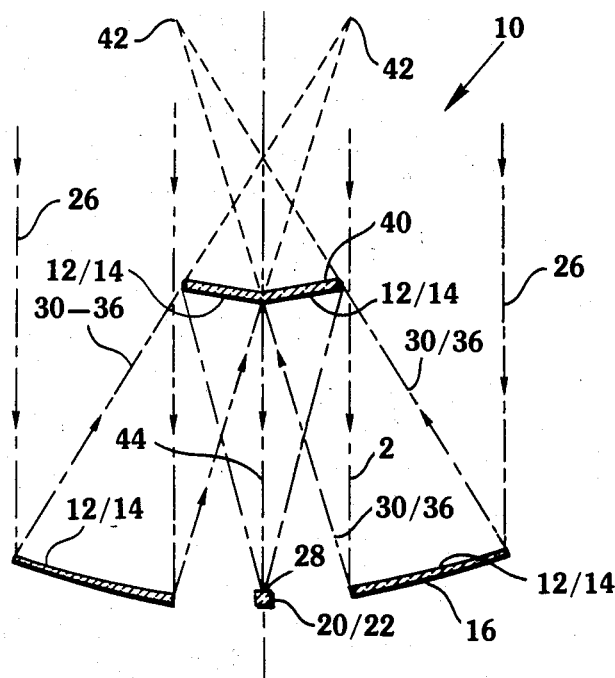
Figure 2C:
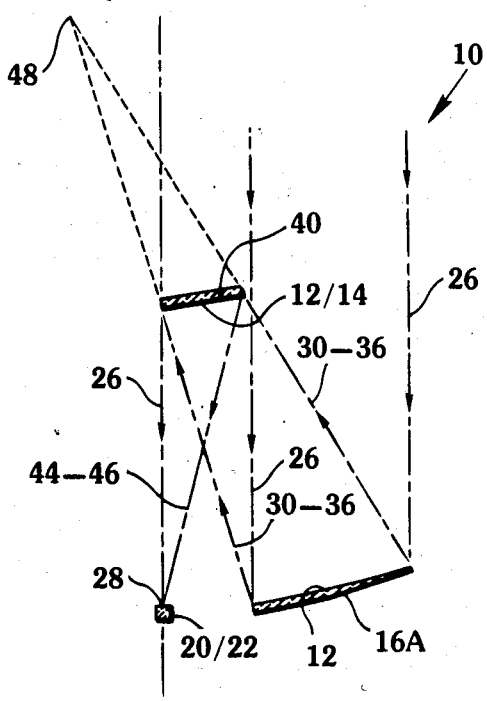

In FIGS. 2A–2C as well as the other embodiments of the invention described hereinafter, the same reference numerals will be used to denote the same components and rays to simplify the description.

FIGS. 2A and 2B show another embodiment of the point focus solar concentrator 10 with a pair of parabolic cylindrical primary reflectors 12 and a pair of planar linear Fresnel secondary reflectors 40 arranged in V fashion directing rays 30 toward the heat receiver 20 and solar heat dynamic engine 22. Reflectors 12 and 40 are formed of reflector strips 14 as described above in connection with FIGS. 1A and 1B with the reflector strips 14 of the primary reflectors being parallel (untilted) and of a cylindrical parabolic configuration and having a focal point 42. The reflector strips 14 of the secondary reflectors 40 are flat with each having a different tilt orientation. The two primary reflectors reflect incoming solar rays 26 as wedge-shaped beams 30 onto the secondary reflectors 40 which fold the beams down as rays 44 to the heat receiver 20 and solar dynamic engine 22.

FIG. 2C is a detail of the construction and arrangement of an end section of FIGS. 2A and 2B but depicting a longer focal length identified at 46. Again, in this embodiment, the line foci 36 from the primary reflector 12 are converted into a point focus 28 at the heat receiver 20 providing the needed higher concentration ratio of energy for efficient operation of the solar engine 22.

Figure 3C:
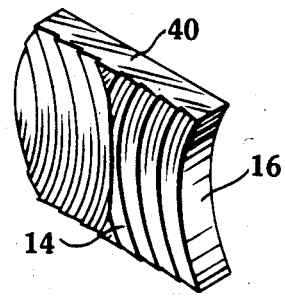
FIG. 3C is an enlarged view of the secondary reflector of FIGS. 3A and 3B, FIGS. 4A and 4B are simplified schematic frontal and end illustrations of the invention utilizing a primary reflector with parallel cylindrical parabolic reflector strips all having same focal length, and a linear Fresnel secondary reflector comprising tilted flat reflector strips positioned on a frame which is tilted to minimize changes in focal length.
Figure 3A:
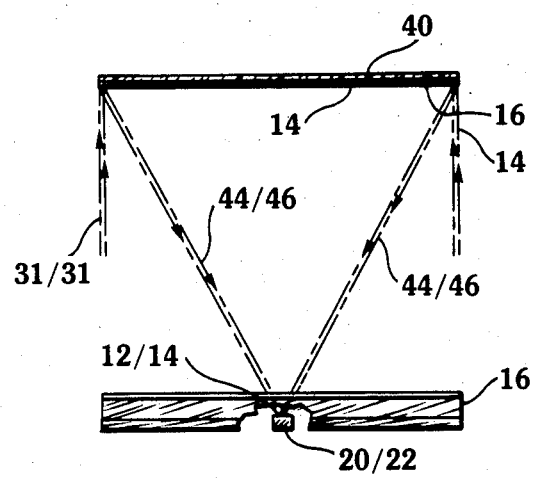
FIGS. 3A and 3B are simplified schematic frontal and side illustrations of the invention using parallel (not tilted) primary parabolic reflector strips each having the same focal length and a secondary reflector comprising cylindrical hyperbolic reflector strips of varying focal lengths.
Figure 3B:
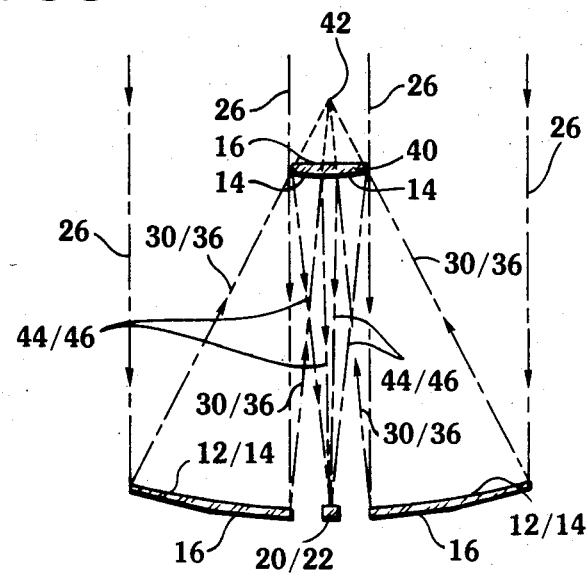

FIGS. 3A and 3B are simplified schematic frontal and side illustrations of the invention with a primary reflector 12 using parallel (non-tilted) primary parabolic reflector strips 14, each having the same focal length and a secondary reflector 40 comprising cylindrical hyperbolic reflector strips 14 of varying focal lengths. The primary reflectors 12 direct rays toward the hyperbolic secondary Fresnel reflector 40 which, in turn, folds the beams toward the focal point 28. Again, as in the prior Figures, the heat receiver 20 and solar engine 22 are located at the focal point 28 and in the plane of the inner edges of the two primary reflectors.

FIG. 3C illustrates the hyperbolic pattern of reflector strips 14 on the convex surface in the secondary reflector 40.

Figure 4A:
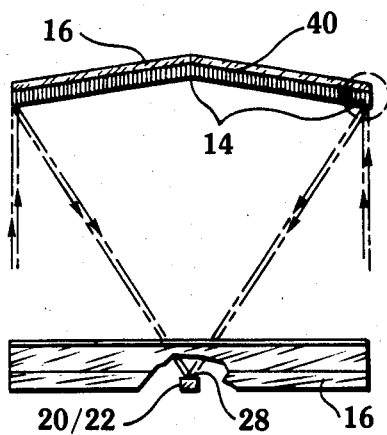
FIG. 4C is another view of the secondary reflector of FIGS. 4A and 4B, FIGS. 5A and 5B are simplified schematic frontal and side illustrations of a pair of parabolic cylindrical primary reflectors and a parabolic cylindrical Fresnel secondary reflector with a short focal length.
Figure 4B:
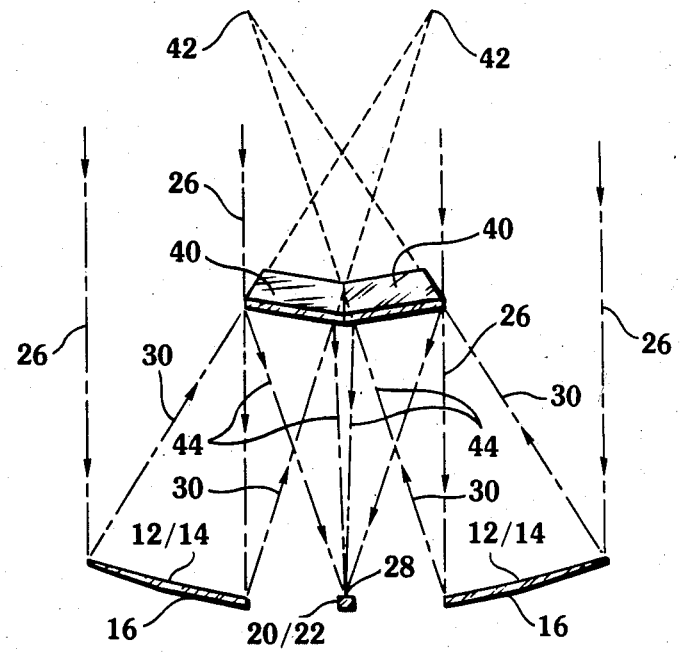

FIGS. 4A and 4B illustrate the frontal and side views of a pair of uniform cylindrical reflectors 12 directing the solar rays towards the secondary reflector 40 which intercept rays 30 and direct the reflected rays 44 toward focal point 28, heat receiver 20 and solar engine 22. In this case, the secondary reflector comprises planar Fresnel reflectors 40 formed of tilted reflector strips 14 arranged in a double V fashion.

Figure 4C:
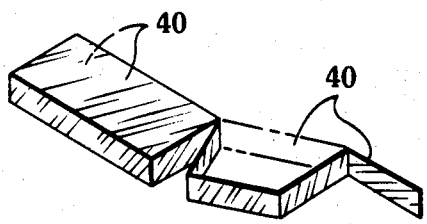

FIG. 4C is another view of the double V arrangement of secondary reflectors 40.

Figure 5A:
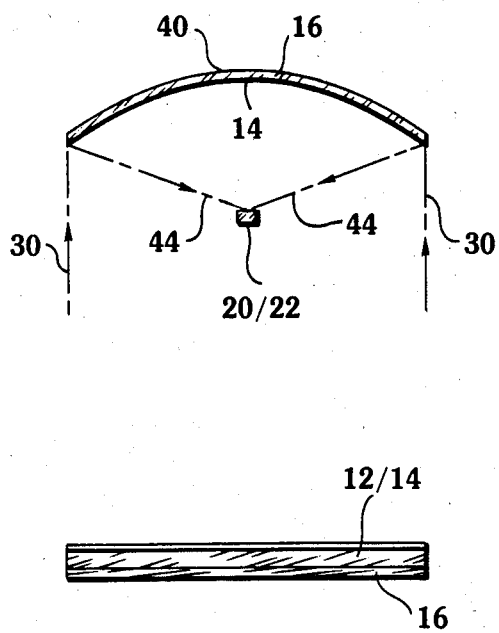
Figure 5B:
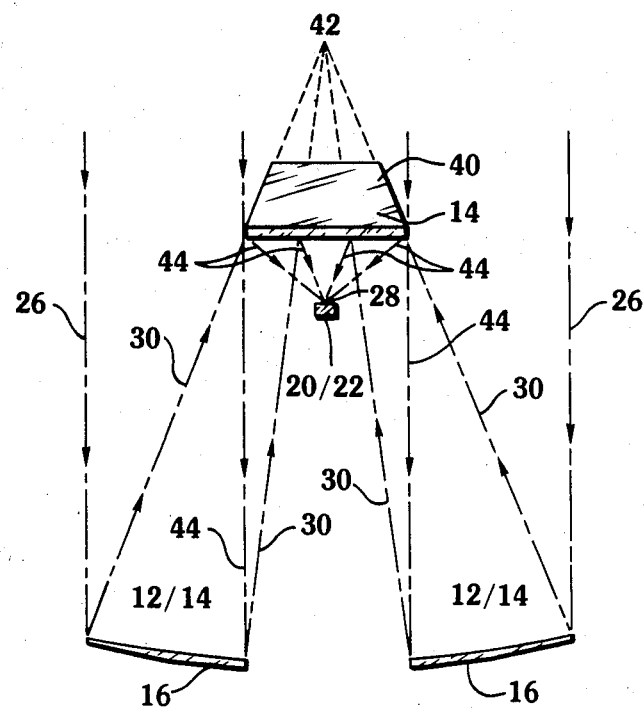

The frontal and side views of FIGS. 5A and 5B show a pair of parabolic cylindrical primary reflectors 12 directing the rays 30 toward a parabolic cylindrical Fresnel reflector 40 which in turn directs the rays 44 towards focal point 28, heat receiver 20 and solar engine 22. In this embodiment, the focal point 28, heat receiver 20 and solar engine 22 are located closer to the secondary reflector.

Figure 6:
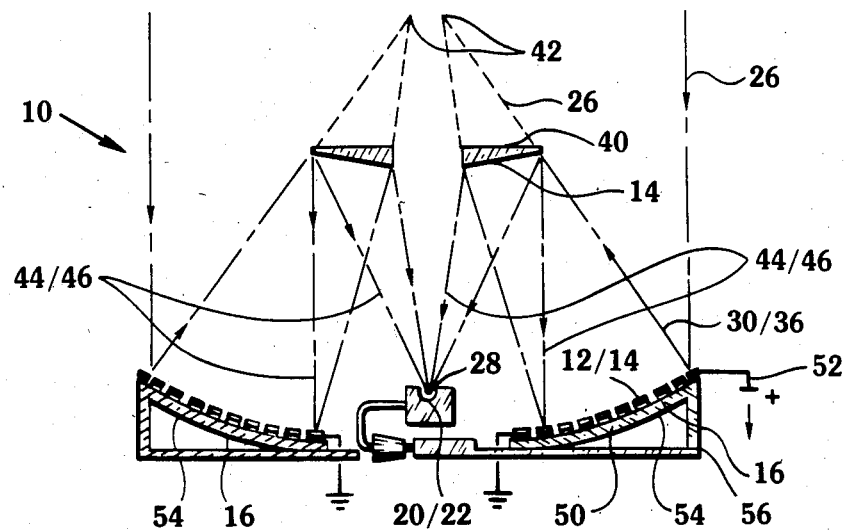
FIG. 6 is a simplified side view of a primary reflector and secondary reflector showing a combined solar photovoltaic/ solar-dynamic engine system.

Turning now to FIG. 6, there is shown combined solar concentrator 10 and photovoltaic or thermophotovoltaic system 10 including primary reflectors 12 with spaced apart reflector strips 14 and a plurality of photovoltaic or thermophotovoltaic solar cells 50 positioned on the primary reflector 12 between but not necessarily in the plane of the reflector strips 14. These cells 50 are shown connected in series and to ground at one end. The other end is a positive terminal 52 adapted to be connected to any suitable receiver (not shown). The cells 50 are spaced apart sufficiently to allow the primary reflectors 12 to direct solar energy to the secondary reflectors 40 where the rays 30 are intercepted and folded back to the point focus 28 and to heat receiver 20 and solar engine 22 as described above. The unused energy, reflected off the front and back side of the solar cells also can be directed toward the secondary reflector 40 since the cells follow the contour of the latter. This provides a more effective use of the solar spectrum, since solar cells operate with the high energy, "blue bands" while solar dynamic engines can perform well at any energy band.

The combination of the solar cells 50 of FIG. 6 may be used with any of the point focus concentrators previously described. This Figure also shows another embodiment of a primary reflector, i.e., the top reflector strips 14 may be flexible and placed on a more solid surface 54 and supported by stands 56.

Figure 7A:
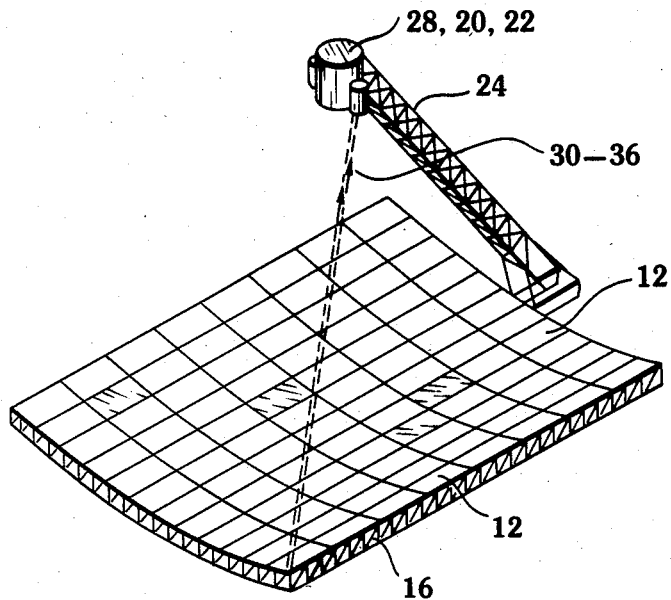
FIGS. 7A and 7B illustrate a detailed embodiment of the solar concentrators of this invention using a plurality of primary mirrors as part of a point focus system for space use.
Figure 7B:
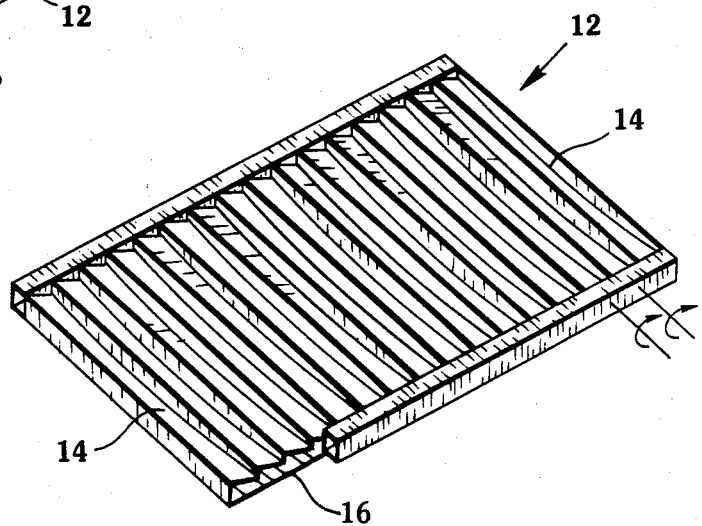
Figures 8A, 8B:
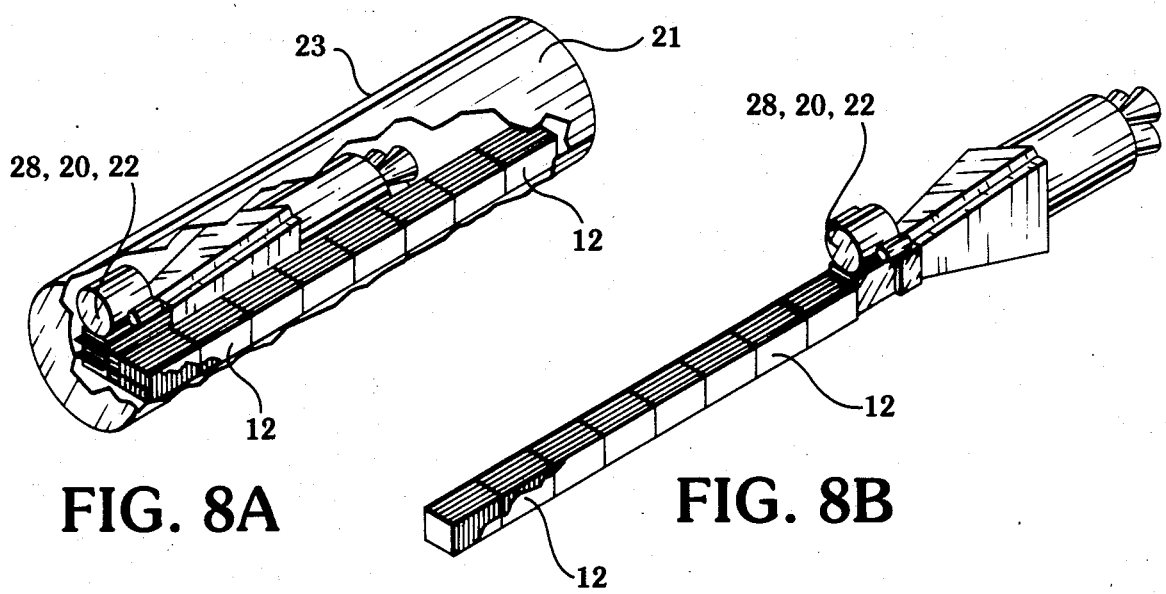
FIGS. 8A-8D shows the sequence of unfolding the embodiment of FIG. 7A from a launch vehicle.
Figure 8C:
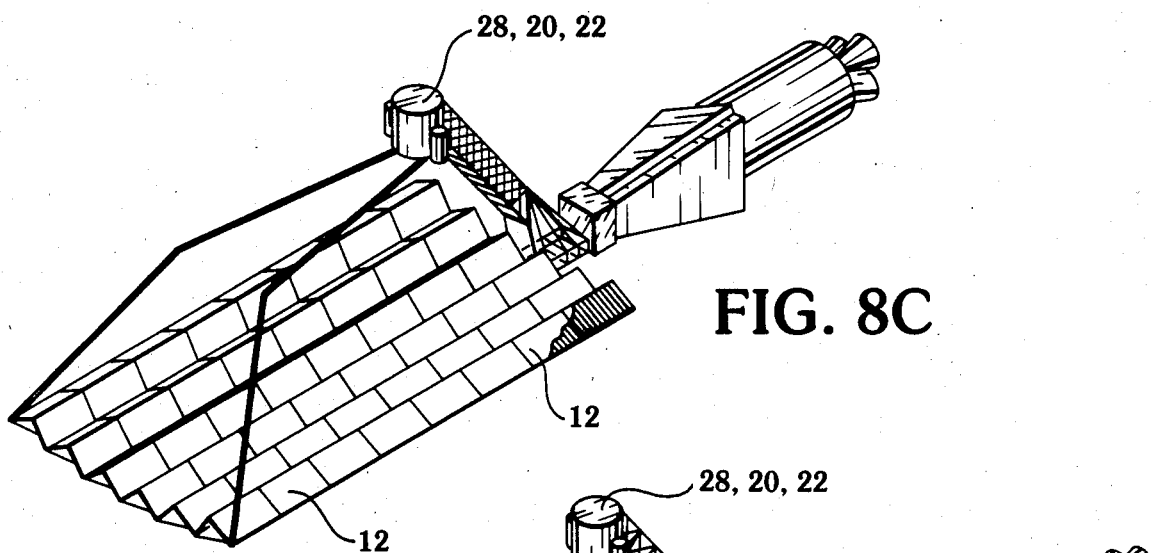
Figure 8D:
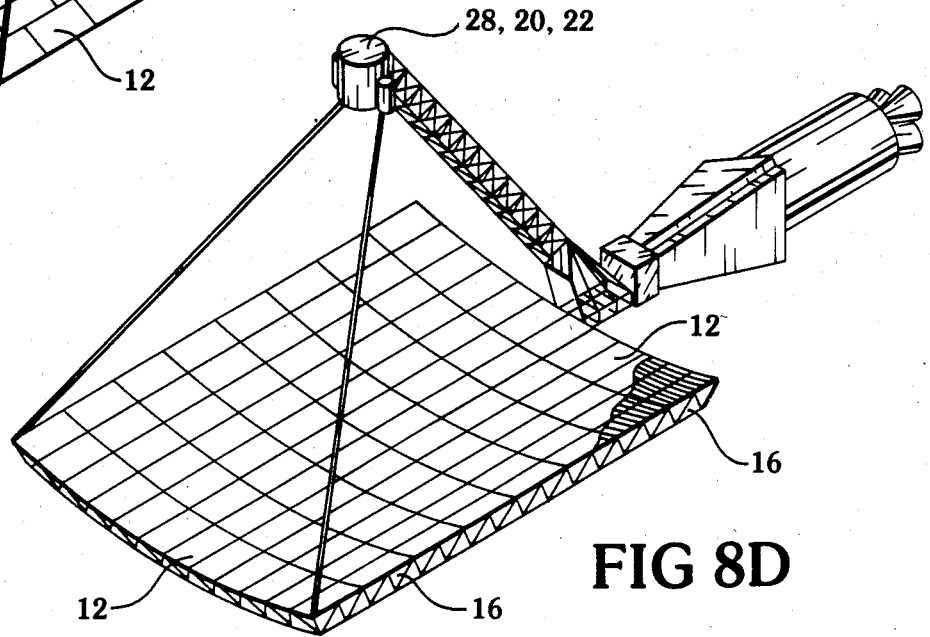

FIGS. 7A and 7B illustrate a plurality of primary reflectors 12 of the type shown in FIGS. 1A–C directing solar flux to a point focus 28, heat receiver 20 and solar engine 22. Like FIG. 1A and 1C, the heat receiver 20 and solar engine 22 are supported on a suitable support 24. In FIG. 7B the support base 16 for the tilted strips 14 also form fins of a heat pipe radiator.

FIGS. 8A through 8D depict the reflector system of FIG. 7A packed in the payload envelope 21 of a launch vehicle 23 and sequential steps of deployment after release into space.

FIG. 7B shows in more detail how the panel may be deflected to focus the solar rays onto the focal point 28. In the foreign specifications, the invention has been described with reference to specific exemplary embodiments thereof. It will, however, be evident that various modifications and changes may be made thereunto without departing from the broader spirit and scope of the invention as set forth in the appended claims. The specifications and drawings are, accordingly, to be regarded in an illustrative rather than in a restrictive sense.

We claim:

1. A point focus solar concentrator comprising, at least one primary reflector having a central opening therethrough containing cylindrical parabolic reflector strips that direct solar flux towards line foci at selected focal lengths, means for making said line foci coincide at a point focus, comprising a fresnel reflector of a selected geometric configuration substantially overlaying said opening positioned between the parabolic reflector strips and said line foci to intercept and reflect said flux from said first reflector towards the point focus, and a solar energy receiver positioned to receive the solar flux directed to said point focus.

2. The point focus solar concentrator as claimed in claim 1 wherein said reflector strips are disposed in a tilted fashion.

3. The point focus concentrator as claimed in claim 2 wherein said reflector strips act as fins for a heat pipe radiator for rejecting heat created during operation.

4. The point focus solar concentrator as claimed in claim 1 wherein said primary reflector has a cylindrical contour of varying geometry to provide focal length correction and wherein said Fresnel reflector in planar.

5. The point focus solar concentrator as claimed in claim 1 wherein said primary reflector strips are of fixed focal length and said Fresnel reflector is hyperbolic.

6. The point focus solar concentrator as claimed in claim 1 wherein said primary reflector strips are of uniform focal length and said Fresnel reflector is planar and tilted with respect to said primary reflector.

7. The point focus solar concentrator as claimed in claim 1 wherein said primary reflector includes a plurality of solar cells positioned on the reflector and connected to provide additional solar energy output.

* * * * *